United States Patent
Yamate et al.

[11] Patent Number: 5,272,451
[45] Date of Patent: Dec. 21, 1993

[54] CLOCK REPRODUCING CIRCUIT FOR ELIMINATING AN UNNECESSARY SPECTRUM

[75] Inventors: Kazunori Yamate, Osaka; Keiichi Danmoto, Kyoto, both of Japan

[73] Assignee: Matsushita Electric Industrial Co., Ltd., Japan

[21] Appl. No.: 838,794
[22] PCT Filed: Jul. 17, 1991
[86] PCT No.: PCT/JP91/00953
  § 371 Date: Mar. 17, 1992
  § 102(e) Date: Mar. 17, 1992
[87] PCT Pub. No.: WO92/02080
  PCT Pub. Date: Jun. 2, 1992

[30] Foreign Application Priority Data
  Jul. 20, 1990 [JP] Japan .................. 2-190755

[51] Int. Cl.$^5$ .................. H03L 7/07; H03L 7/093
[52] U.S. Cl. .................. 331/2; 331/17; 331/25
[58] Field of Search .................. 331/2, 17, 25

[56] References Cited
U.S. PATENT DOCUMENTS
4,180,783  12/1979  Khalifa .................. 331/2
4,806,879  2/1989   Troxel .................. 331/2

FOREIGN PATENT DOCUMENTS
0204088  12/1986  European Pat. Off. .
55-153488 11/1980 Japan .
57-36048   2/1982  Japan .
58-19029   2/1983  Japan .
58-137333  8/1983  Japan .
63-164619  7/1988  Japan .

Primary Examiner—Siegfried H. Grimm
Attorney, Agent, or Firm—Lowe, Price, LeBlanc & Becker

[57] ABSTRACT

A clock reproducing circuit for improving S/N of a PWM D/A converter is provided with a first clock reproducing portion (11) employing a crystal (11a) and a voltage controlled oscillator (11b) and with a second clock reproducing portion (12) for performing a frequency multiplication of an output signal of the first clock reproducing portion (11) to generate a proper clock signal. The second clock reproducing portion (12) consists of a phase comparator (22), loop filter, a resistance capacitance type voltage controlled oscillator (26) and a frequency divider (25). Further, the loop filter is provided with a second LPF (24) for controlling the oscillation frequency of the resistance capacitance type voltage controlled oscillator (26) and with a filter (23) having a cut-off frequency higher than that of the second LPF (24) and also having filter characteristics, by which frequency components having frequencies higher than or equal to the frequency of a signal output from the first clock reproducing portion (11) can be cut off, thereby preventing frequency components corresponding to unnecessary spectra from being mixed into an input signal to the D/A converter.

5 Claims, 3 Drawing Sheets

10 : CLOCK REPRODUCING UNIT
14 : DATA SHIFT CLOCK
15 : DISCRIMINATION SIGNAL
16 : (SERIAL) DATA

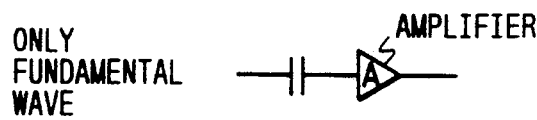
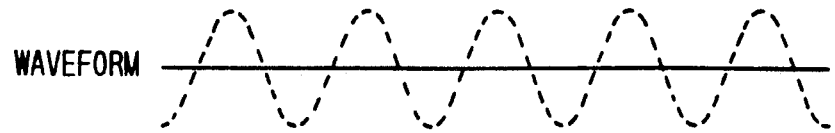
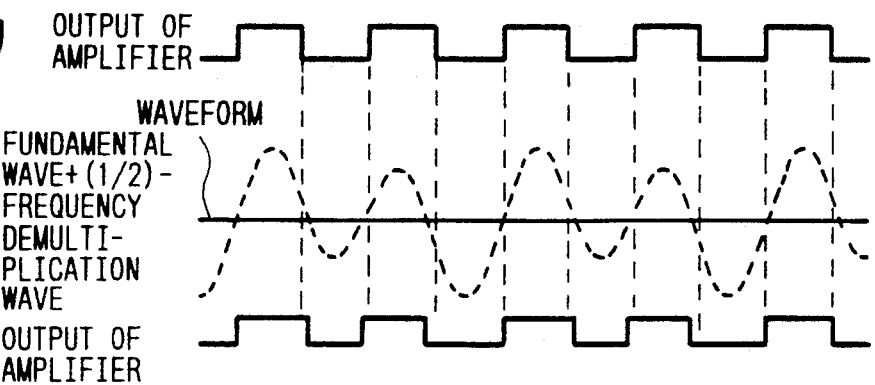
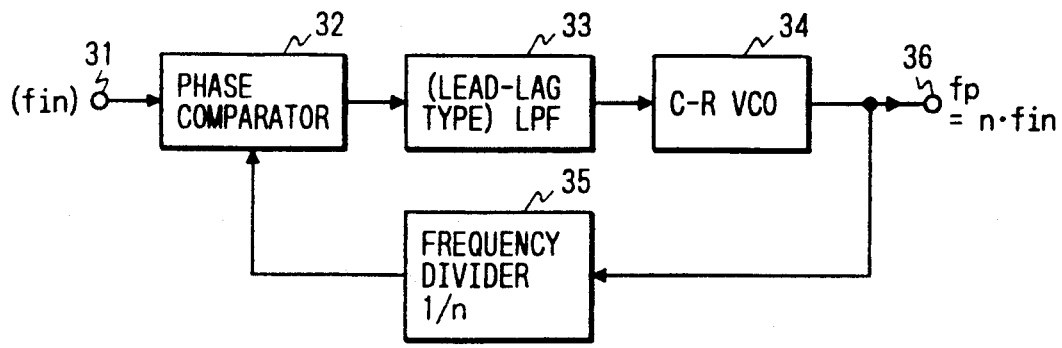

CLOCK REPRODUCING CIRCUIT FOR ELIMINATING AN UNNECESSARY SPECTRUM

TECHNICAL FIELD

This invention relates to a clock reproducing or regenerating circuit for use in a pulse-width modulation (hereunder referred to as PWM) digital-to-analog (D/A) converter for the purpose of improving a signal-to-noise ratio (S/N) of the PWM D/A converter.

BACKGROUND ART

It has been a long time since equipments employing digital techniques had come to be put to practical use. In such an equipment, a D/A converter is used in a process in which a digital processing is performed on a digital quantity obtained as a result of a digitization of an analog quantity and thereafter another digital quantity representing the result of the digital processing is converted into another analog quantity. Heretofore, a D/A converter of what is called the resistance-ladder type, which is typified by an R-2R ladder D/A converter, has been used for such a purpose. Nowadays, integrated-circuit (IC) D/A converters have been developed with the intention of reducing costs. Increase in quantization number, however, results in rise of production costs of IC D/A converters for obtaining a desired conversion precision because of the fact that the conversion precision of an IC D/A converter depends on the accuracy of resistance of the internal circuit thereof. Recently, it has come to attempt to increase the conversion precision of a D/A converter by employing a PWM IC D/A circuit which can obtain a desired conversion precision independent of the accuracy of the resistance of the internal circuit thereof by utilizing a logic circuit thereof and employing PWM. However, with increase in conversion precision, the frequency of a fundamental clock input to the PWM D/A converter increases to the extent that no clocks supplied by a crystal oscillator for outputting a fundamental wave can have. Thus a frequency multiplier is employed therein as a countermeasure to such a problem.

However, lately, three kinds of equipments (namely, a compact-disk player (CD), a digital audio tape recorder (DAT) and a broadcasting-by-satellite (BS) tuner) respectively using different sampling frequencies have been put to practical use. As the result, a clock, the frequency of which is a specific multiple of the input sampling frequency, becomes necessary as a PCM clock. Further, it becomes necessary to change the frequency of a PWM clock according to the sampling frequency of an input signal, on which a D/A conversion should be performed. Furthermore, as described above, the frequency of a clock to be input to the PWM D/A converter becomes too high for the fundamental oscillation of a crystal oscillator to supply. Thus, a frequency multiplier employing a phase lock loop, another frequency multiplier utilizing what is called overtone oscillations and a frequency doubler utilizing an inductance or transformer (namely, a device for obtaining various frequencies, which are twice, triple or more the frequency of the fundamental oscillation, by utilizing parallel resonance achieved by means of an inductance and a capacity connected in parallel) have been proposed as means for obtaining higher clock frequencies. The frequency multiplier utilizing overtone oscillations and the frequency doubler, however, are unsuited for IC fabrication because they require inductive components. Consequently, the frequency multiplier employing a PLL is usually used. At that time, a spectrum of an unnecessary frequency component in case of performing a frequency division in a switching circuit, as well as a spectrum of another unnecessary frequency component occurring due to lead-lag filter characteristics of the frequency multiplier employing a PLL, is observed as illustrated in FIG. 1. Thus it turns out that the S/N of the PWM D/A converter is degraded due to the spectra of the unnecessary components. The results of a simulation of the manner of such degradation is described in an article entitled "Consideration on Clock Jitters in PWM D/A Converters", T. Kaneaki et al. (Matsushita Electric Industrial Co., Ltd. AV Research Laboratory), Kouen-Ronbun-Shu (in Japanese), The Acoustical Society of Japan, October 1988, pp. 411–412. It is described in this article as a conclusion of the simulation that "a clock jitter increases a noise level and further the noise level is proportional to the quantity of jitters". When an unnecessary spectrum is generated at a frequency, which is one nth the frequency of the fundamental wave of a clock to be input to a PWM D/A converter (incidentally, n is a given integer), as shown in FIG. 1 (incidentally, FIG. 1 illustrates a case where n is equal to 2), an output signal has waveforms of FIG. 2, which is represented with respect to time. Waveform (a) of FIG. 2 is a waveform diagram for showing a waveform of the output signal in case where only the fundamental wave of the clock for the PWM D/A converter is present. Waveform (b) of FIG. 2 is a waveform diagram for showing another waveform of the output signal in case where a wave (hereunder sometimes referred to as a one-half frequency-division wave), the frequency of which is one-half the frequency of the fundamental wave of the clock, is mixed into the fundamental wave of the clock for the PWM D/A converter. Namely, waveform (b) of FIG. 2 shows the output signal, which is represented with respect to time, in case where the signal having the spectra of FIG. 1, which is represented with respect to frequency, is input to the converter.

Then, if an output signal of the logic circuit of the converter is made to pass through an amplifier shown at a, of FIG. 3, which is of the type that feeds back an output signal of an inverter of the logic circuit of the converter to an input terminal of the inverter, the waveform of the output signal thereof becomes as illustrated in FIG. 1(b) or 1(c). Namely, the waveform of the output signal of the amplifier, which is output therefrom in case where only the fundamental wave (a) of FIG. 2 is input to the converter, becomes as illustrated at (b) in FIG. 3. Further, the waveform of the output signal of the amplifier, which is output therefrom in case where both of the fundamental wave of (b) in FIG. 3 and the one-half frequency division wave are input to the converter, becomes as illustrated at (c) in FIG. 3. Namely, in case of the waveform (c) of FIG. 3, jitters occur and as the result noises are increased as described in the foregoing article. Further, an example of the frequency multiplier utilizing a PLL is illustrated in FIG. 4. As shown in FIG. 4, an input signal $V_{in}$ is input from an input terminal 31 to a phase comparator 32. Moreover, an output of a frequency divider 35, the division ratio of which is (1/n), is also input to the phase comparator 32. Then, an output of the phase comparator 32 is input to a low-pass filter (LPF) 33. The oscillation frequency of a C-R voltage-controlled oscillator (VCO) 34 is controlled according to an output of the LPF 33. An output signal of this VCO 34 is issued from a terminal 36 thereof as a clock signal ($f_p$).

Here, it is assumed that the input signal $V_{in}$ is represented by $$V_{in} = A\sin(\omega_{in}t + \theta(t)) \tag{1}$$

where A denotes the amplitude of the input signal; $\omega_{in}$ the angular frequency thereof; and $\theta(t)$ the phase thereof.

Moreover, it is supposed that an output signal of an frequency divider 35 is obtained by $$V_{out} = \sum_{j=1}^{\infty} B_j \cos(j \cdot \omega_{in}t + \theta_j(t)). \tag{2}$$

Generally, a sinusoidal output is not obtained as the output of the frequency divider 35. Thus a harmonic, the frequency of which is an integral multiple of that $\omega_{in}$, is generated as the output thereof. Further, a multiplier is employed as the phase comparator 32. Therefore, an output $V_c$ thereof can be represented by $$V_c = V_{in} \cdot V_{out} \tag{3}$$

Then, substitution of the equations (1) and (2) into the equation (3) gives $$V_c = A\sin(\omega_{in}t + \theta(t)) \cdot \sum_{j=1}^{\infty} B_j \cos(j \cdot \omega_{in}t + \theta_j(t)). \tag{4}$$

Further, the equation (4) can be rewritten as follows by removing $\Sigma$ from the second term on the right hand thereof:

$$\begin{aligned}V_c = &A\sin(\omega_{in}t + \theta(t)) \cdot B_1\cos(\omega_{in}t + \theta_1(t)) + \\ &A\sin(\omega_{in}t + \theta(t)) \cdot B_2\cos(2\omega_{in}t + \theta_2(t)) + \\ &A\sin(\omega_{in}t + \theta(t)) \cdot B_3\cos(3\omega_{in}t + \theta_3(t)) + \\ &\vdots \\ &A\sin(\omega_{in}t + \theta(t)) \cdot B_j\cos(j \cdot \omega_{in}t + \theta_j(t))\end{aligned} \tag{5}$$

Furthermore, the equation (5) can be rewritten as follows by expanding each term on the right hand thereof, which has the form of sin×cos:

$$\begin{aligned}V_c = &(A \cdot B_1/2)[\sin\{2\omega_{in}t + \theta(t) + \theta_1(t)\} + \\ &\sin\{\theta(t) - \theta_1(t)\}] + \\ &(A \cdot B_2/2)[\sin\{3\omega_{in}t + \theta(t) + \theta_2(t)\} + \\ &\sin\{-\omega_{in}t + \theta(t) - \theta_2(t)\}] + \\ &(A \cdot B_3/2)[\sin\{4\omega_{in}t + \theta(t) + \theta_3(t)\} + \\ &\sin\{-2\omega_{in}t + \theta(t) - \theta_3(t)\}] + \\ &\vdots \\ &(A \cdot B_j/2)[\sin\{(1 + j)\omega_{in}t + \theta(t) + \theta_j(t)\} + \\ &\sin\{(1 - j)\omega_{in}t + \theta(t) - \theta_j(t)\}] + \\ &\vdots\end{aligned} \tag{6}$$

Thus a harmonic, the angular frequency of which is an integral multiple of $\omega_{in}$, is produced as an output of the phase comparator 32. Generally, the values of the amplitudes $B_j$ of the above described equations meet the following inequality:

$$B_1 < B_2 < B_3 < \ldots < B_j < \ldots$$

Then, ordinary harmonic components are eliminated by the LPF 33 which is employed in the PLL. Incidentally, a lead-lag type LPF is employed as the LPF to ensure what is called a fast pull-in position characteristic of the PLL. The lead-lag type filter, however, has characteristics that the amplitude thereof does not converge on zero but becomes constant and in a high-frequency region. Thus a control signal including harmonics, the frequencies of which are integral multiples of $\omega_{in}$, is input to the C-R VCO 34. As the result, unnecessary spectra are respectively generated at frequencies of $f_{in} \times 1, f_{in} \times 2, f_{in} \times 3 \ldots \ldots f_{in} \times j$ when an output of the C-R VCO 34, namely, a clock output therefrom is in a state in which the amplitude level thereof is largest at the frequency of $f_P = n \cdot f_{in}$. Consequently, there is raised a problem that jitters are generated due to components, which have frequencies lower than $f_P$, corresponding to these unnecessary spectra as described above (by referring to FIGS. 1 to 3) and thus the S/N of the PWM D/A is degraded.

The present invention is accomplished to resolve such a problem. It is, accordingly, an object of the present invention to provide a clock reproducing circuit for eliminating an unnecessary spectrum.

DISCLOSURE OF INVENTION

In accordance with the present invention, there is provided a clock reproducing circuit for use in a PWM D/A converter, which comprises first and second clock reproducing portions. The first clock reproducing portion is provided with a voltage controlled oscillator (VCO) utilizing a crystal. In case where a clock frequency for a PWM D/A converter is $f_P$, the crystal VCO reproduces or regenerates a clock at a frequency of ($f_P$/n) (incidentally, n is an integer). Further, an output of this crystal VCO (corresponding to the first clock reproducing portion) is used as an input to the second clock reproducing portion. This second clock reproducing portion is provided with a resistance-capacitance type VCO (namely, an R-C VCO) which oscillates at the frequency of $f_P$ and is used to multiply the frequency of ($f_P$/n) by n (incidentally, n is an integer). The second clock reproducing portion is composed of a loop filter, an R-C VCO and a frequency divider, the division ratio of which is n (incidentally, n is an integer). Further, the loop filter has two stages. Incidentally, the second stage of the loop filter is a lead-lag type LPF used to determine the proper characteristics of the PLL. Moreover, there are two kinds of filters which can be employed as the first stage of the loop filter. One is an LPF, the cut-off frequency of which is selected in such a manner to be higher than that of the lead-lag PLL and to achieve sufficient attenuation of frequency components having frequencies equal to or higher than $f_P$/n. The other is a filter composing a trap circuit, the trap frequency of which is selected as ($f_P$/n)×k (incidentally, k is an integer). Additionally, the order of the filters of the first and second stages may be reversed. Furthermore, unnecessary spectra generated in the "divide-by-n" frequency divider and the phase comparator can be removed by the LPF or by the trap circuit of the first stage. As the result, a clock, which has the frequency of $f_P$ and is so "pure" that no unnecessary spectrum is included therein, can be obtained by the second clock reproducing portion. Consequently, the S/N of the PWM D/A converter can be improved.

Thus, with the above described configuration, no unnecessary spectra occur in the first clock reproducing portion because the VCO employing a crystal is used therein to process an input signal. Further, in the second clock reproducing portion, the R-C VCO is employed and thus the VCO follows a control voltage obtained by the phase comparator and the loop filter. The loop filter consists of the first filter and the second LPF. Further, the first filter may be an LPF, which has a cut-off frequency higher than the cut-off frequency of the second LPF and can sufficiently eliminate components having the frequency of $f_P/n$ or more. Alternatively, the first filter may be a trap circuit comprised of filters, each of which has a trap frequency of $(f_P/n) \times k$ (incidentally, k is an integer). Thereby, harmonics, the frequencies of which are integral multiples of the frequency of $f_P/n$, can be eliminated. This is because all of unnecessary spectra correspond to harmonics having the angular frequencies, which are integral multiples of $\omega_{in}$ (corresponding to the frequency of $f_P/n$) as indicated by the equation (6). Consequently, a clock, which has the frequency of $f_P = n \cdot f_{in}$ and includes no unnecessary spectrum therein, can be obtained as an output of the R-C VCO.

BRIEF DESCRIPTION OF DRAWINGS

FIG. 3 is an illustration of the amplifier (a) and of waveforms (b) and (c) of outputs of the amplifier with respect to time FIG. 4 is a schematic block diagram for illustrating the configuration of a conventional frequency multiplier circuit;

BEST MODE FOR CARRYING OUT THE INVENTION

Figure 1:
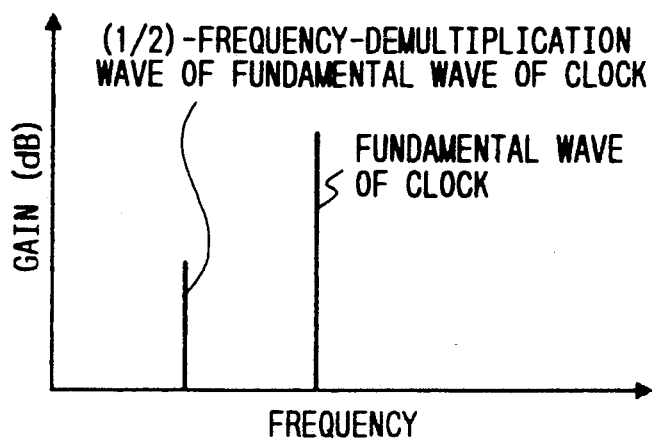
FIG. 1 is a diagram for illustrating spectra of a clock at the time when a clock jitter is caused.
Figure 2A:
FIG. 2 is a waveform diagram for illustrating two waveforms (a) and (b), wherein waveform (a) is a waveform of the clock, which has only the spectrum of the fundamental wave of FIG. 1, with respect to time and waveform (b) is a waveform of the clock with respect to time in case where the frequency-division wave is mixed into the fundamental wave of the clock as illustrated in FIG. 1.
Figure 2B:
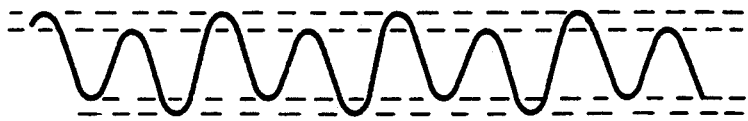
Figure 5A:
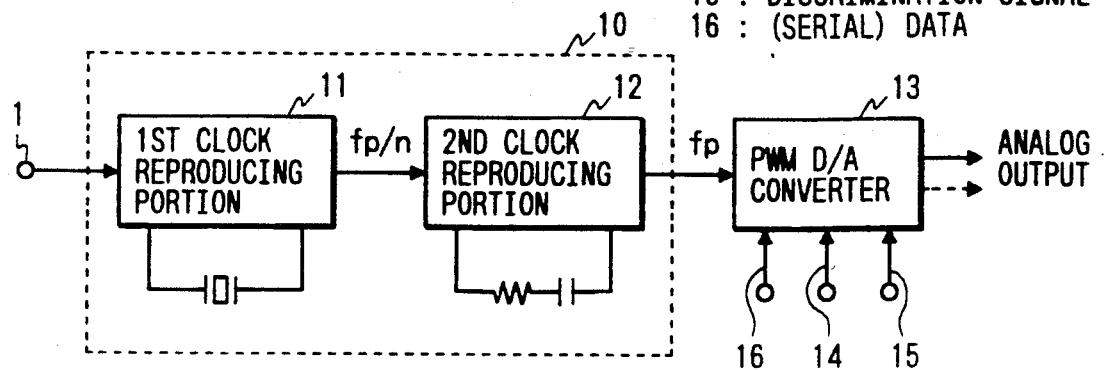
FIG. 5(a) is a schematic block diagram of the entire configuration of a clock reproducing circuit embodying the present invention.
Figure 5B:
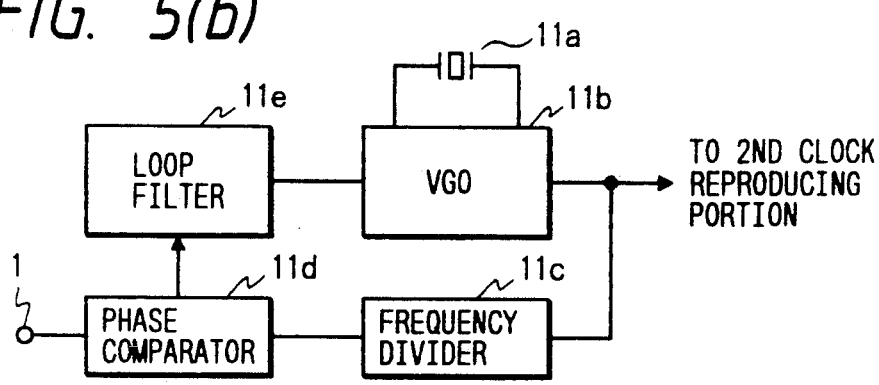
FIG. 5(b) is a block diagram of the first clock reproducing portion of FIG. 5(a)
Figure 5C:
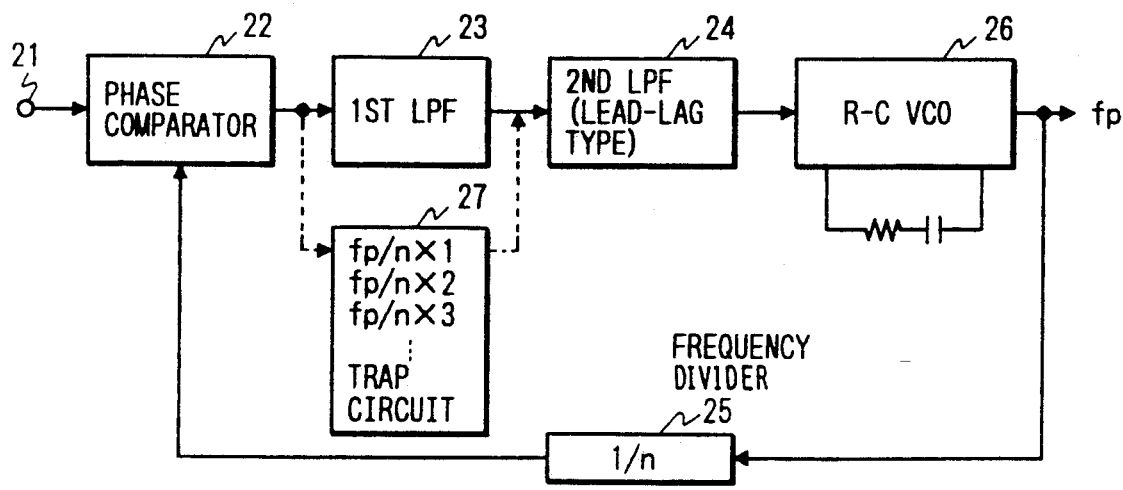
FIG. 5(c) is a block diagram of the second clock reproducing portion of FIG. 5(a).

The invention is illustrated at FIGS. 5(a)-5(c). In FIG. 5(a), reference numeral 1 designates a signal input terminal; and 10 a clock reproducing unit composed of the first clock reproducing portion 11 and the second clock reproducing portion 12. Further, reference numeral 13 denotes a PWM D/A converter; 14, 15 and 16 represent data shift clock, a discrimination signal and a serial data signal representing serial data to be input to the PWM D/A converter 13, respectively. The first clock reproducing portion 11 has the structure illustrated in FIG. 5(b). In FIG. 5(b), reference character 11a designates a crystal which oscillates at a frequency of, for instance, 12 megahertz (MHz); 11b a VCO; 11c a frequency divider; and 11d a phase comparator connected to the signal input terminal 1 at an input terminal thereof. Further, an output of the VCO 11b is supplied to the second clock reproducing portion 12. Moreover, the second clock reproducing portion 12 has the structure illustrated in FIG. 5(c). In this figure, reference numeral 21 designates a terminal to which is applied a signal output from the first clock reproducing portion 11; 22 a phase comparator to which the signal input from the terminal 21 and an output signal of the frequency divider 25 are input; 23 a first LPF to which an output of the phase comparator 22 is input; 24 a second lead-lag type LPF to which an output of the first LPF is input; 26 an R-C VCO, the oscillation frequency of which is controlled according to an output of the second LPF 24; and 27 a trap circuit which is available instead of the first LPF 23.

Next, an operation of the above described embodiment will be described hereinbelow. In the device of FIG. 5(a), an input signal having the frequency of, for example, 2 MHz is input to the first clock reproducing portion 11. Then, the first clock reproducing portion 11 performs clock reproduction at a frequency, which is $(1/n)$ of the frequency $f_p$ of the fundamental clock to be input to the PWM D/A converter 13, by using a crystal (incidentally, n is an integer). Thus, an output signal, which has the frequency of $f_p/n$, of the first clock reproducing portion 11 is input to the second clock reproducing portion 12. Subsequently, the second clock reproducing portion 12 performs clock reproduction at the frequency of $f_p$ by using an R-C oscillator. Upon completion of such clock reproduction, an output signal, which has the frequency of $f_p$, of the second clock reproducing portion 12 is input to the PWM D/A converter 13. Incidentally, a serial data signal 16, a data shift clock 14 and a discrimination signal 15 are also input to the PWM D/A converter 13. The discrimination signal 15 indicating which of first and second channels data to be converted corresponds to is used in case where the PWM D/A converter 13 converts data of two channels (namely, the first and second channels).

In the portion of FIG. 5(c), an input signal having the frequency of $f_p/n$ is input to one of terminals of the phase comparator 22. To the other terminal thereof, an output signal of the R-C VCO 26 is input thereto through the frequency divider 25. Thus a phase comparison of the signals input to the comparator 22 is effected therein. Then, an output of the phase comparator 22 is input to the first LPF 23 or to the trap circuit 27. Incidentally, filtering characteristics of the first LPF 23 are selected in such a manner that the cut-off frequency thereof is higher than that of the second (lead-lag type) LPF 24, which has the proper loop-filter characteristics, of the PLL and moreover frequency components having frequencies equal to or higher than $f_p/n$ can sufficiently be attenuated. Furthermore, the trap circuit 27 has trap characteristics, by which frequency components having frequencies of $f_p/n \times k$ (incidentally, k is an integer), namely, $f_p/n$, $2f_p/n$, $3f_p/n \ldots kf_p/n$ ... are attenuated. Thereby, harmonic components expressed by the equation (6) can be eliminated by such a filter. Consequently, a signal, the harmonic components of which are thus eliminated, representing information on results of the phase comparison is input to the second (lead-lag type) LPF 24. Thus this LPF obtains proper characteristics thereof and controls the R-C VCO 26.

INDUSTRIAL APPLICABILITY

As is apparent from the foregoing description of the embodiment, the device of the present invention can supply a clock with high spectral "purity", the frequency of which is high to the extent that the fundamental oscillation mode of a crystal cannot provide. Further, the clock supplied by the device of the present invention is most suitable for being used by the PWM D/A converter. Thus the S/N of the PWM D/A converter can be increased. Moreover, the device of the present invention can provide a clock, the frequency of which is higher than the oscillation frequency of the crystal VCO, by performing clock reproduction once in the crystal VCO and then effecting frequency multiplication of an output signal of the crystal VCO by using the R-C VCO. Additionally, to obtain high clock frequency, a conventional overtone crystal oscillator employing a crystal, a conventional frequency doubler circuit utilizing an inductance or transformer, and the like are used. However, inductive components or transformers are indispensable to these conventional devices and becomes externally provided thereto at the time of IC fabrication thereof. This is disadvantageous to reduction in production costs of and a high-density packaging of these conventional devices. In contrast, in case of the device of the present invention, a crystal oscillator is externally provided thereto, while the R-C VCO can be included in IC thereof. Namely, the device of the present invention does not require the inductive components or parts as provided to the conventional devices. Consequently, the present invention has the effect of achieving considerable reduction in production costs of a clock reproducing device.

We claim:

1. A clock reproducing circuit comprising:
   a first clock reproducing portion having a voltage controlled oscillator, which employs a crystal, said first clock reproducing portion receiving an input signal having a predetermined frequency, for reproducing a first clock signal, the frequency of which is equal to $f_p/n$ ($f_p$ is the frequency of a fundamental clock to be input to a pulse-width modulation digital-to-analog converter; and n is an integer) from the input signal and for outputting the first clock signal, the first clock reproducing portion having a portion for generating a signal including a voltage for controlling the voltage controlled oscillator, on the basis of the input signal and the first clock signal; and
   a second clock reproducing portion for receiving the first clock signal and reproducing and outputting a second clock signal, the frequency of which is equal to $f_p$, wherein the second clock reproducing portion comprises:
   a resistance-capacitance type voltage controlled oscillator for outputting a signal, the frequency of which is equal to $f_p$;
   a frequency divider for performing a frequency division of the signal, which has the frequency of $f_p$ and is output from the resistance-capacitance type voltage controlled oscillator, and for outputting a signal representing a result of the frequency division;
   a phase comparator for receiving the first clock signal as a first input signal thereto and also receiving the signal output from the frequency divider as a second input signal thereto;
   a second low-pass filter connected to the resistance-capacitance type voltage controlled oscillator for controlling an oscillation frequency of the resistance-capacitance type voltage controlled oscillator; and
   a first low-pass filter, the cut-off frequency of which is higher than that of the second low-pass filter, having filtering characteristics, by which frequency components having frequencies equal to or higher than $f_p/n$ can be cut off, the first low-pass filter being connected to the phase comparator and the second low-pass filter and receiving and filtering an output signal of the phase comparator, the second low-pass filter receiving and filtering an output signal of the first low-pass filter.

2. The clock reproducing circuit according to claim 1, wherein the second low-pass filter is connected to an output terminal of the phase comparator, and wherein the first low-pass filter is inserted between the second low-pass filter and the resistance-capacitance type voltage controlled oscillator.

3. A clock reproducing circuit comprising:
   a first clock reproducing portion having a voltage controlled oscillator, which employs a crystal, said first clock reproducing portion receiving an input signal having a predetermined frequency, for reproducing a first clock signal, the frequency of which is equal to $f_p/n$ ($f_p$ is the frequency of a fundamental clock to be input to a pulse-width modulation digital-to-analog converter; and n is an integer) from the input signal and for outputting the first clock signal, the first clock reproducing portion having a portion for generating a signal including a voltage for controlling the voltage controlled oscillator, on the basis of the input signal and the first clock signal; and
   a second clock reproducing portion for receiving the first clock signal and reproducing and outputting a second clock signal, the frequency of which is equal to $f_p$, wherein the second clock reproducing portion comprises:
   a resistance-capacitance type voltage controlled oscillator for outputting a signal, the frequency of which is equal to $f_p$;
   a frequency divider for performing a frequency division of the signal, which has the frequency of $f_p$ and is output from the resistance-capacitance type voltage controlled oscillator, and for outputting a signal representing a result of the frequency division;
   a phase comparator for receiving the first clock signal as a first input signal thereto and also receiving the signal output from the frequency divider as a second input signal thereto;
   a low-pass filter connected to the resistance-capacitance type voltage controlled oscillator for controlling an oscillation frequency of the resistance-capacitance type voltage controlled oscillator; and
   a trap circuit having trap characteristics, by which frequency components having frequencies of $f_p/n \times k$ (k is an integer) are attenuated, the trap circuit being connected to the phase comparator and the low-pass filter and receiving and filtering an output signal of the phase comparator, the low-pass filter receiving and filtering an output signal of the trap circuit.

4. The clock reproducing circuit according to claim 3, wherein said low-pass filter is further connected for outputting to the resistance-capacitance type voltage controlled oscillator a signal to be used for controlling an oscillation frequency of the resistance-capacitance type voltage controlled oscillator.

5. The clock reproducing circuit according to claim 1, wherein said second low-pass filter is further connected for outputting to the resistance-capacitance type voltage controlled oscillator a signal to be used for controlling an oscillation frequency of the resistance-capacitance type voltage controlled oscillator.

* * * * *